US009786651B2

(12) United States Patent
Tsai et al.

(10) Patent No.: US 9,786,651 B2
(45) Date of Patent: Oct. 10, 2017

(54) ELECTROSTATIC DISCHARGE DEVICE (71) Applicant: MACRONIX INTERNATIONAL CO., LTD., Hsinchu (TW)

(72) Inventors: Ying-Chieh Tsai, Chiayi (TW); Wing-Chor Chan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/045,414

(22) Filed: Feb. 17, 2016

(65) Prior Publication Data
US 2017/0236816 A1    Aug. 17, 2017

(51) Int. Cl.
*H01L 27/02* (2006.01)
*H01L 29/866* (2006.01)
*H01L 29/06* (2006.01)

(52) U.S. Cl.
CPC ...... *H01L 27/0255* (2013.01); *H01L 27/0259* (2013.01); *H01L 27/0292* (2013.01); *H01L 29/0603* (2013.01); *H01L 29/866* (2013.01)

(58) Field of Classification Search
CPC ............. H01L 27/0255; H01L 27/0259; H01L 27/0292; H01L 29/0603; H01L 29/866
See application file for complete search history.

(56) References Cited

U.S. PATENT DOCUMENTS

| | | | |
|---|---|---|---|
| 6,268,639 B1 * | 7/2001 | Li | H01L 27/0251 257/107 |
| 6,285,062 B1 * | 9/2001 | Marr | H01L 27/0255 257/361 |
| 7,768,034 B2 | 8/2010 | Calafut et al. | |
| 2003/0197242 A1 * | 10/2003 | Chen | H01L 21/823878 257/509 |
| 2004/0021178 A1 * | 2/2004 | Larson | H01L 27/0255 257/355 |
| 2004/0129983 A1 * | 7/2004 | Mallikarjunaswamy | H01L 29/49 257/370 |
| 2008/0013231 A1 * | 1/2008 | Bazzano | H01L 27/0259 361/56 |
| 2008/0087963 A1 | 4/2008 | Calafut et al. | |
| 2011/0163352 A1 * | 7/2011 | Gee | H01L 23/60 257/173 |
| 2013/0114173 A1 * | 5/2013 | Chen | H01L 27/0262 361/56 |

FOREIGN PATENT DOCUMENTS

| | | |
|---|---|---|
| CN | 101517743 A | 8/2009 |
| TW | 201203507 A1 | 1/2012 |

* cited by examiner

*Primary Examiner* — Benjamin Sandvik
*Assistant Examiner* — Farid Khan
(74) *Attorney, Agent, or Firm* — Finnegan, Henderson, Farabow, Garrett & Dunner LLP (57) ABSTRACT

An electrostatic discharge device includes a power clamping circuit and an isolation circuit. The power clamping circuit includes a first Zener diode and a second Zener diode. A cathode of the first Zener diode is coupled to a first power supply line. An anode of the first Zener diode is coupled to an anode of the second Zener diode. A cathode of the second Zener diode is coupled to a second power supply line. The isolation circuit includes a first isolation diode and a second isolation diode. A cathode of the first isolation diode is coupled to the first power supply line. An anode of the first isolation diode is coupled to a cathode of the second isolation diode and a circuit being protected. An anode of the second isolation diode is coupled to the second power supply line.

6 Claims, 8 Drawing Sheets

ELECTROSTATIC DISCHARGE DEVICE

TECHNOLOGY FIELD

The disclosure relates to an electrostatic discharge (ESD) protection device and, more particularly, to an ESD protection device having low-capacitance transient voltage suppression (TVS) diodes.

BACKGROUND

Diodes, especially TVS diodes, usually have a low trigger voltage and thus are suitable for on-chip ESD protection. Zener diodes are exemplary TVS diodes that are widely used for ESD protection. For example, an ESD protection device having a Zener diode coupled in parallel with two normal diodes that are coupled in series has been found suitable for protecting high-frequency CMOS I/O ports.

Zener diodes usually have a higher doping concentration than normal diodes. Due to this higher doping concentration, junction capacitance in a Zener diode is usually relatively high, which affects the speed of the circuit being protected. Moreover, at a high current, current crowding may occur due to high clamping voltage.

SUMMARY

In accordance with the disclosure, there is provided an electrostatic discharge device including a power clamping circuit and an isolation circuit. The power clamping circuit includes a first Zener diode and a second Zener diode. A cathode of the first Zener diode is coupled to a first power supply line. An anode of the first Zener diode is coupled to an anode of the second Zener diode. A cathode of the second Zener diode is coupled to a second power supply line. The isolation circuit includes a first isolation diode and a second isolation diode. A cathode of the first isolation diode is coupled to the first power supply line. An anode of the first isolation diode is coupled to a cathode of the second isolation diode and a circuit being protected. An anode of the second isolation diode is coupled to the second power supply line.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include an electrostatic discharge (ESD) protection device having low-capacitance transient voltage suppression (TVS) diodes.

Hereinafter, embodiments consistent with the disclosure will be described with reference to the drawings. Wherever possible, the same reference numbers will be used throughout the drawings to refer to the same or like parts.

Figure 1:
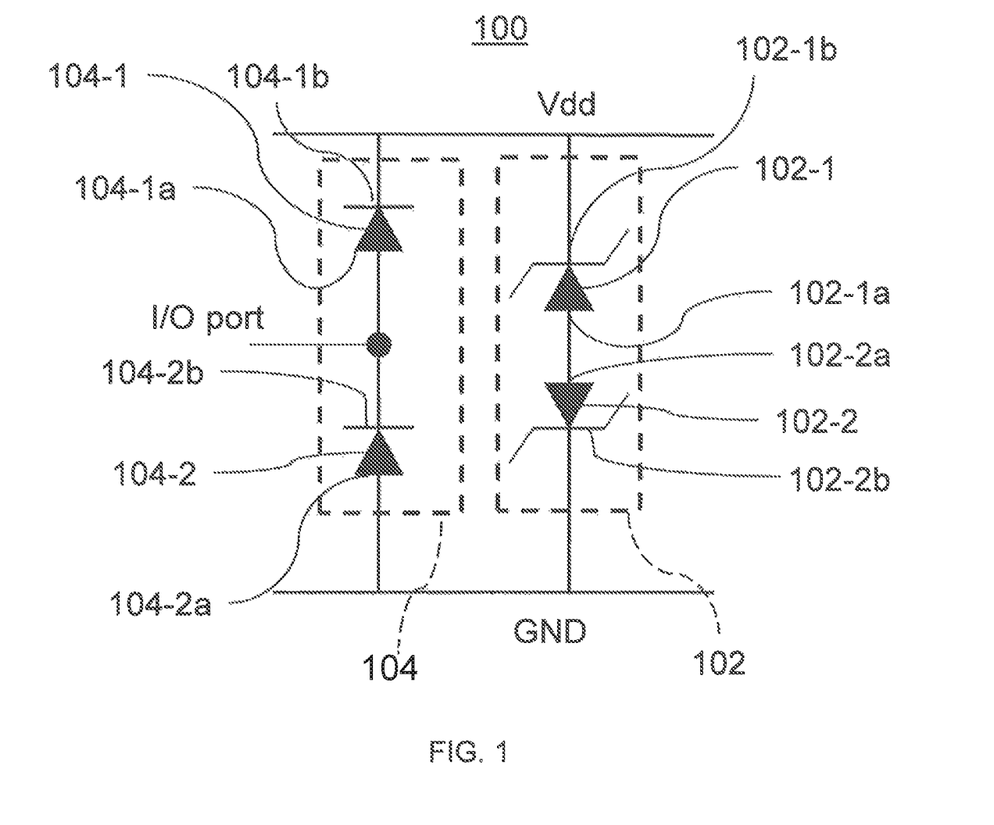
FIG. 1 shows a circuit diagram of an electrostatic discharge (ESD) device according to an exemplary embodiment.

FIG. 1 is a circuit diagram of an ESD protection device 100 consistent with embodiments of the present disclosure. The ESD protection device 100 includes a power clamping circuit 102 and an isolation circuit 104. Each of the power clamping circuit 102 and the isolation circuit 104 is coupled between a first power supply line for providing a power supply voltage Vdd and a second power supply line for providing a circuit reference voltage such as ground (GND).

The power clamping circuit 102 includes a first Zener diode 102-1 and a second Zener diode 102-2 coupled in series. As shown in FIG. 1, the first and second Zener diodes 102-1 and 102-2 are coupled in a back-to-back configuration. That is, the anode 102-1a of the first Zener diode 102-1 is coupled to the anode 102-2a of the second Zener diode 102-2. Further, the cathode 102-1b of the first Zener diode 102-1 and the cathode 102-2b of the second Zener diode 102-2 are coupled to the first power supply line Vdd and the second power supply line GND, respectively.

The isolation circuit 104 includes an upper isolation diode 104-1 and a lower isolation diode 104-2 coupled in series. As shown in FIG. 1, the upper and lower isolation diodes 104-1 and 104-2 are coupled with the same polarity, i.e., the cathode 104-2b of the lower isolation diode 104-2 is coupled to the anode 104-1a of the upper isolation diode 104-1. Thus, the cathode 104-1b of the upper isolation diode 104-1 and the anode 104-2a of the lower isolation diode 104-2 are coupled to the first power supply line Vdd and the second power supply lines GND, respectively. A port coupling point 106 between the upper and lower isolation diodes 104-1 and 104-2 is coupled to an input/output (I/O) port of a circuit being protected by the ESD protection device 100. For example, the I/O port may be a DVI display port, a USB port, or an HDMI port. According to the present disclosure, at least one of the upper isolation diode 104-1 or the lower isolation diode 104-2 includes a thyristor-equivalent structure, as described below. In some embodiments, one of the upper and lower isolation diodes 104-1 and 104-2 does not include the thyristor-equivalent structure, but can be a normal diode.

The ESD protection device 100 shown in FIG. 1 includes one isolation circuit 104. However, an ESD protection device consistent with the present disclosure may include more than one isolation circuits 104, depending on the number of I/O ports to be protected.

Figure 2:
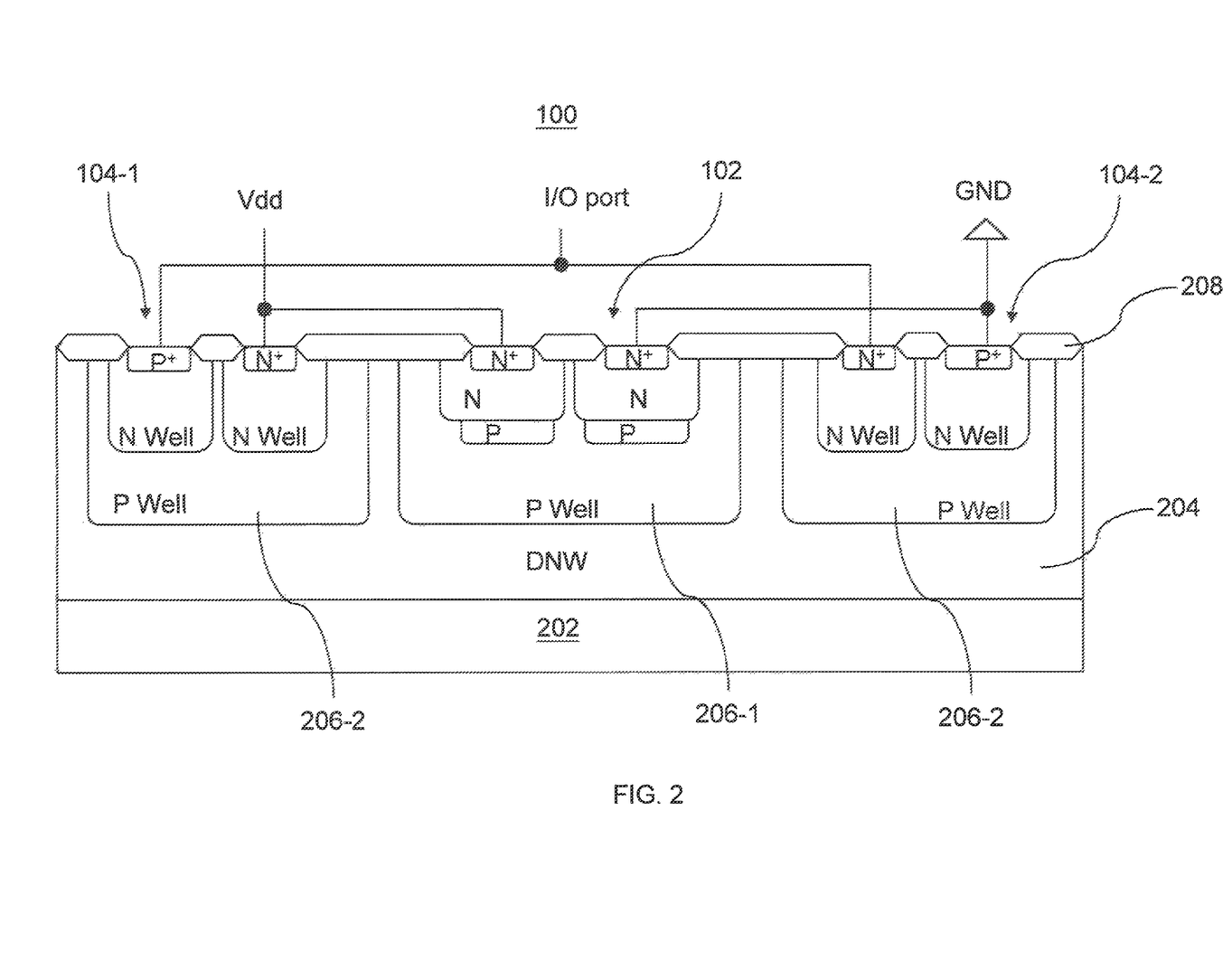
FIG. 2 is an exemplary cross-sectional view of the ESD protection device shown in FIG. 1.

FIG. 2 is an exemplary cross-sectional view of the ESD protection device 100 consistent with embodiments of the present disclosure. As shown in FIG. 2, the ESD protection device 100 is formed in a semiconductor substrate 202. The semiconductor substrate 202 may be a P-type semiconductor substrate, such as a P-type silicon substrate. Further, the semiconductor substrate 202 may be a silicon-on-insulator substrate. The ESD protection device 100 includes a deep N-type well (DNW) 204 formed in the semiconductor substrate 202. The DNW 204 is doped with an N-type dopant, such as phosphorus or arsenic, at a concentration of about $1 \times 10^{16}$ cm$^{-3}$ to about $5 \times 10^{16}$ cm$^{-3}$. In some embodiment, the DNW 204 can be replaced by an N-type epitaxial layer.

As shown in FIG. 2, the power clamping circuit 102 is formed in a first P-type well (P Well) 206-1. Each of the upper and lower isolation diodes 104-1 and 104-2 is formed in one of second P Wells 206-2. The P Wells 206-1 and 206-2 are doped with a P-type dopant, such as boron, at a concentration of about $1 \times 10^{7}$ cm$^{-3}$ to about $5 \times 10^{17}$ cm$^{-3}$. In FIG. 2, the upper and lower isolation diodes 104-1 and 104-2 have a similar structure. In other embodiments, as described above, the upper and lower isolation diodes 104-1 and 104-2 can have different structures and one of the isolation diodes can have a normal diode structure different from structures described in the present disclosure.

The ESD protection device 100 further includes insulating isolation regions 208 configured to isolate various doping regions. In FIG. 2, field oxide isolation regions are illustrated as an example of the insulating isolation regions 208. In other embodiments, the insulating isolation regions 208 can include a different isolation structure, such as shallow trench isolation or deep trench isolation.

Figure 3A:
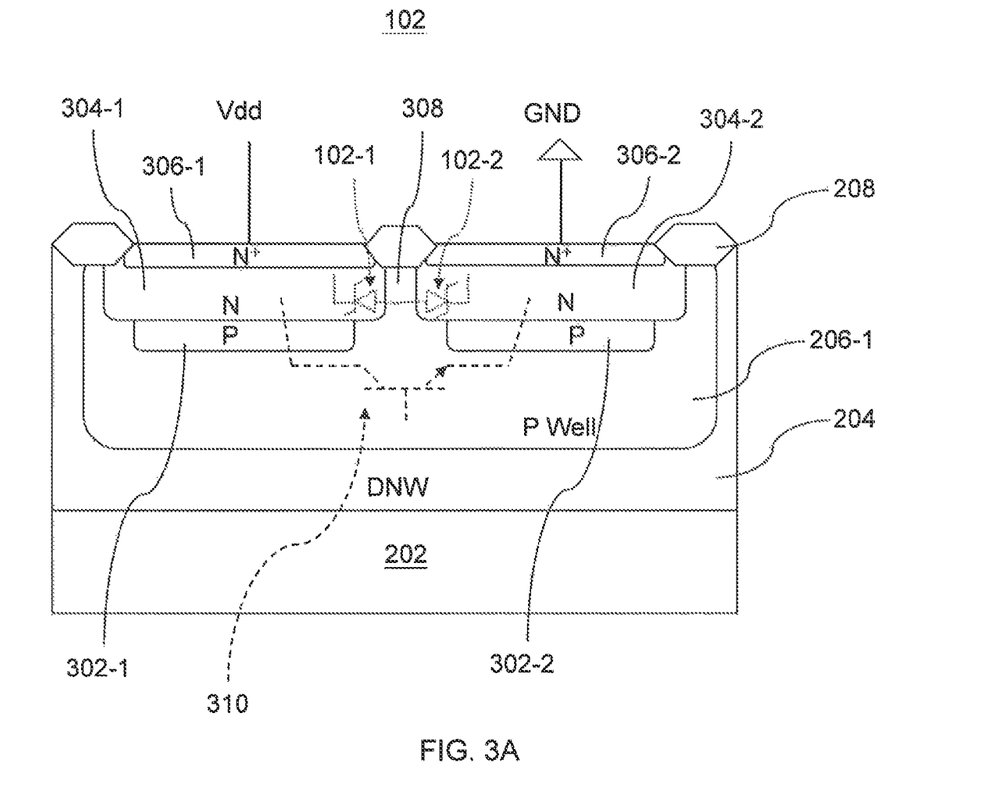
FIGS. 3A and 3B are a cross-sectional view and an equivalent circuit, respectively, of a power clamping circuit according to an exemplary embodiment.

FIG. 3A is an enlarged cross-sectional view of the power clamping circuit 102 shown in FIG. 2. As shown in FIG. 3A, the power clamping circuit 102 further includes a first P-type region 302-1 and a second P-type region 302-2 formed in the first P Well 206-1. The first and second P-type regions 302-1 and 302-2 are doped with a P-type dopant, such as boron, at a concentration of about $5 \times 10^{17}$ cm$^{-3}$ to about $1 \times 10^{18}$ cm$^{-3}$. In some embodiments, each of the first and second P-type regions 302-1 and 302-2 is doped at a doping level higher than the doping level of the first P Well 206-1.

The power clamping circuit 102 also includes a first N-type region 304-1 formed to overlap a portion of the first P-type region 302-1 and a second N-type region 304-2 formed to overlap a portion of the second P-type region 302-2. The first and second N-type regions 304-1 and 304-2 are doped with an N-type dopant, such as phosphorus or arsenic, at a concentration of about $1 \times 10^{18}$ cm$^{-3}$ to about $1 \times 10^{19}$ cm$^{-3}$. A first heavily-doped N-type (N$^+$) region 306-1 and a second N$^+$ region 306-2 are formed over the first and second N-type regions 304-1 and 304-2, respectively. In the present disclosure, an N$^+$ region refers to a region doped with an N-type dopant at a concentration equal to or higher than about $2 \times 10^{19}$ cm$^{-3}$. For example, the first and second N$^+$ regions 306-1 and 306-2 are doped with an N-type dopant, such as phosphorus or arsenic, at a concentration of about $2 \times 10^{19}$ cm$^{-3}$ to about $5 \times 10^{19}$ cm$^{-3}$. According to the present disclosure, the first and second N$^+$ regions 306-1 and 306-2 serve as N-side contact layers of the first and second Zener diodes 102-1 and 102-2, respectively. Thus, the first N$^+$ region 306-1 is coupled to the first power supply line Vdd, while the second N$^+$ region 306-2 is coupled to the second power supply line GND. In some embodiments, the first and second N$^+$ regions 306-1 and 306-2, and other heavily doped regions described below that serve as contact layers to be coupled to external electrical components (such as the first and/or the second power supply line), can have, for example, a hexagonal shape, an octagonal shape, or a circular shape in a plan view.

As shown in FIG. 3A, the first and second N-type regions 304-1 and 304-2 sandwich a portion of the first P Well 206-1, which is referred to here as a Zener P region 308. As annotated in FIG. 3A, the first N-type region 304-1 and the Zener P region 308 constitute the basic structure of the first Zener diode 102-1, while the second N-type region 304-2 and the Zener P region 308 constitute the basic structure of the second Zener diode 102-2.

Figure 3B:
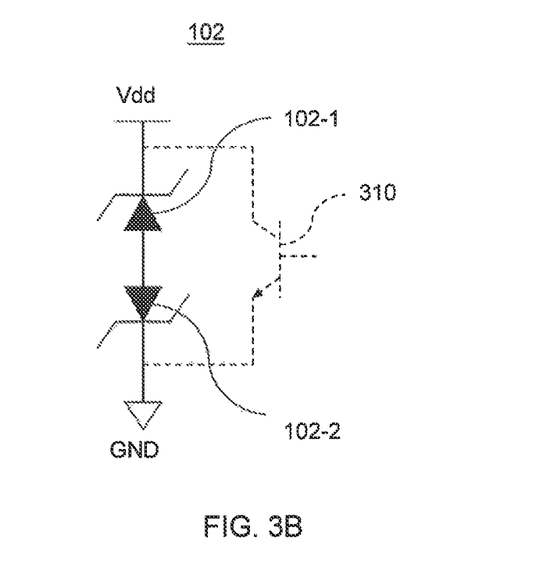

Further, as shown in FIG. 3A, due to the symmetric back-to-back configuration of the power clamping circuit 102 formed in the first P Well 206-1, a parasitic NPN bipolar-junction transistor (BJT) structure 310 is formed inside the power clamping circuit 102, in addition to the first and second Zener diodes 102-1 and 102-2. The NPN BJT structure 310 includes the first and second N-type regions 304-1 and 304-2, the first and second P-type regions 302-1 and 302-2, and the first P Well 206-1. The first and second N-type regions 304-1 and 304-2 serve as the collector and the emitter, respectively, of the NPN BJT structure 310. The first P Well 206-1 serves as the base of the NPN BJT structure 310. An equivalent circuit of the structure in FIG. 3A is shown in FIG. 3B, with the parasitic NPN BJT structure 310 represented using dashed lines.

According to the present disclosure, the parasitic NPN BJT structure 310 forms another current path in addition to the current path formed by the first and second Zener diodes 102-1 and 102-2. When the ESD voltage is high, the parasitic NPN BJT structure 310 is turned on, allowing excessive ESD current to be conducted through the parasitic NPN BJT structure 301. As such, the current conducting capability of the power clamping circuit 102 is increased and the power clamping circuit 102 can handle a larger ESD current than a conventional ESD protection device. Moreover, since the parasitic NPN BJT structure 310 is formed at a relatively deeper location in the device structure than the first and second Zener diodes 102-1 and 102-2, excessive ESD current can be conducted through this deeper path. As a result, current crowding at the surface of the power clamping circuit 102 is reduced.

Figure 4A:
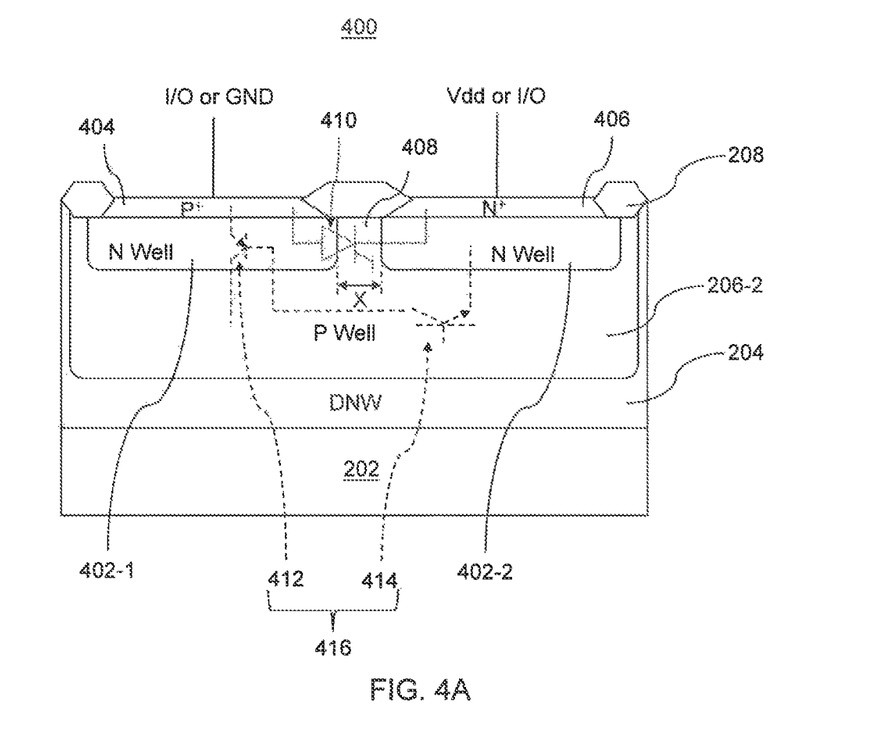
FIGS. 4A and 4B are a cross-sectional view and an equivalent circuit, respectively, of an isolation diode according to an exemplary embodiment.

FIG. 4A is a cross-sectional view of an exemplary isolation diode 400 consistent with the present disclosure. As discussed above, the isolation diode 400 can be implemented as one or both of the upper and lower isolation diodes 104-1 and 104-2. As shown in FIG. 4A, the isolation diode 400 includes a first N-type well (N Well) 402-1 and a second N Well 402-2 formed in the P Well 206-2. The first and second N Wells 402-1 and 402-2 are doped with an N-type dopant, such as phosphorus or arsenic, at a concentration of about $5 \times 10^{17}$ cm$^{-3}$ to about $1 \times 10^{18}$ cm$^{-3}$. The isolation diode 400 further includes a heavily-doped P-type (P$^+$) region 404 and a third N$^+$ region 406 formed over the first and second N Wells 402-1 and 402-2, respectively. In the present disclosure, a P$^+$ region refers to a region doped with a P-type dopant at a concentration equal to or higher than about $2 \times 10^{19}$ cm$^{-3}$. For example, the P$^+$ region 404 is doped with a P-type dopant, such as boron, at a concentration of about $2 \times 10^{19}$ cm$^{-3}$ to about $5 \times 10^{19}$ cm$^{-3}$, while the third N$^+$ region 406 is doped with an N-type dopant, such as phosphorus or arsenic, at a concentration of about $2\times10^{19}$ cm$^{-3}$ to about $5\times10^{19}$ cm$^{-3}$. According to the present disclosure the P$^+$ region 404 and the third N$^+$ region 406 serve as a P-side contact layer and an N-side contact layer, respectively, of the isolation diode 400. Depending on whether the isolation diode 400 is used as the upper isolation diode 104-1 or the lower isolation diode 104-2, the P$^+$ region 404 and the third N$^+$ region 406 are coupled to the I/O port and the first power supply line Vdd, respectively, or coupled to the second power supply line GND and the I/O port, respectively.

Figure 4B:
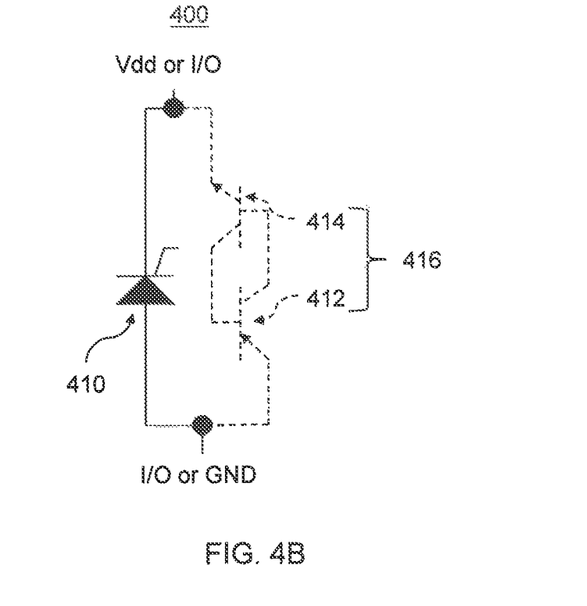

As shown in FIG. 4A, the first and second N Wells 402-1 and 402-2 sandwich a portion of the second P Well 206-2, which is referred to here as a common P region 408. As annotated in FIG. 4A, the P$^+$ region 404, the first N Well 402-1, the common P region 408, and the second N Well 402-2 constitute a thyristor-equivalent structure 410. Moreover, the P$^+$ region 404, the first N Well 402-1, and the second P Well 206-2 form a parasitic PNP BJT structure 412. Similarly, the first N Well 402-1, the second P Well 206-2, and the second N Well 402-2 form a parasitic NPN BJT structure 414. The parasitic PNP BJT structure 412 and the parasitic NPN BJT structure 414 constitute a parasitic thyristor structure 416, which is also referred to herein as a parasitic silicon-controlled rectifier (SCR) structure. An equivalent circuit of the isolation diode 400 is shown in FIG. 4B, with the parasitic SCR structure 416 represented using dashed lines.

According to the present disclosure, when the voltage, i.e., a reverse bias, applied between the third N$^+$ region 406 and the P$^+$ region 404 increases, a depletion region at an interface between the second N Well 402-2 and the common P region 408 and a depletion region at an interface between the first N Well 402-1 and the common P region 408 expand. When the reverse bias is higher than a certain level, these two depletion regions connect with each other, a condition referred to as "punch-through," forming an electrical path between the first and second N Wells 402-1 and 402-2. In this situation, the first and second N Wells 402-1 and 402-2 equivalently become one N-type region, and thus the thyristor-equivalent structure 410 equivalently functions as a reverse-biased diode. Further, the punch-through also triggers the turning on of the parasitic SCR structure 416. Similar to the parasitic NPN BJT structure 310 in the power clamping circuit 102, the turned-on parasitic SCR structure 416 provides an additional, deeper current path for conducting the ESD current.

According to the present disclosure, the distance X between the first and second N Wells 402-1 and 402-2 is chosen to improve the performance of the isolation diode 400. For example, the distance X should be short enough to allow the punch-through to occur when ESD occurs. A short distance X also improves the gain of the parasitic PNP BJT structure 412 and thus improves the current conducting capability of the parasitic SCR structure 416. On the other hand, the distance X should be long enough so that the isolation diode 400 would not be turned on at a low reverse bias, i.e., the isolation diode 400 would not be accidentally triggered by a relatively small fluctuation of the voltage at the first power line Vdd that does not result from an ESD event. In some embodiments, the distance X is in the range of about 0.2 μm to about 5 μm.

Figure 5A:
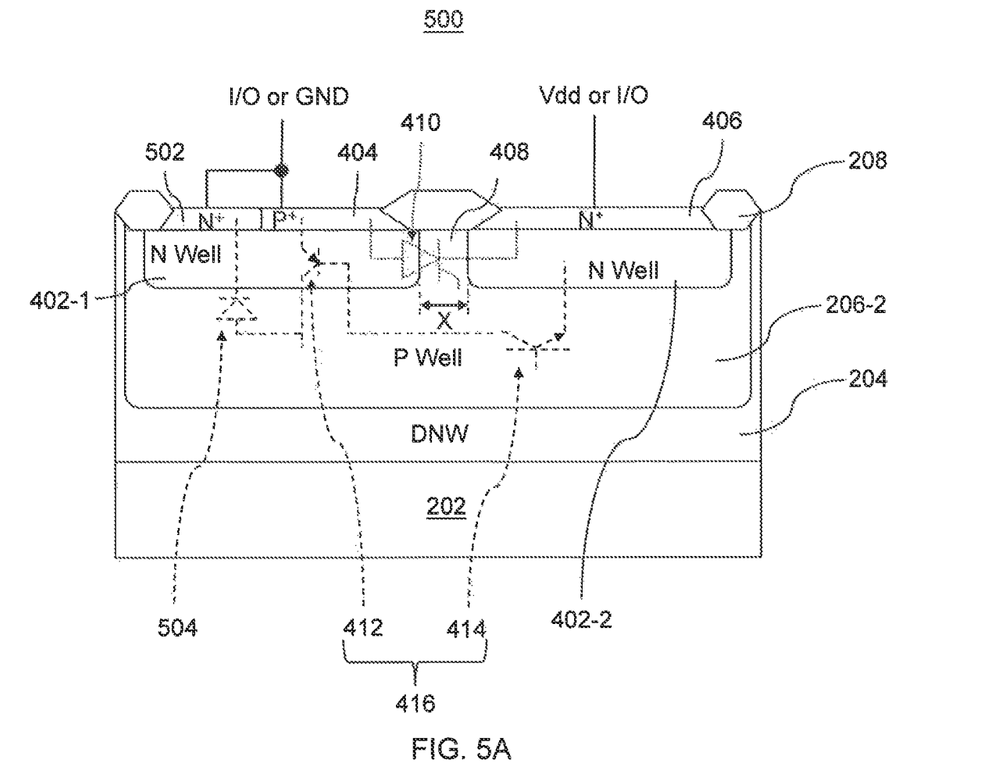
FIGS. 5A and 5B are a cross-sectional view and an equivalent circuit, respectively, of an isolation diode according to another exemplary embodiment.

FIG. 5A is a cross-sectional view of another exemplary isolation diode 500 consistent with the present disclosure. The isolation diode 500 is similar to the isolation diode 400, except that the isolation diode 500 further includes a fourth N$^+$ region 502 formed in the P$^+$ region 404. The fourth N$^+$ region 502 is doped with an N-type dopant, such as phosphorus or arsenic, at a concentration of about $2\times10^{19}$ cm$^{-3}$ to about $5\times10^{19}$ cm$^{-3}$. Similar to the P$^+$ region 404, the fourth N$^+$ region 502 is also coupled to the I/O port or the second power supply line GND, depending on whether the isolation diode 500 is used as the upper isolation diode 104-1 or the lower isolation diode 104-2. For example, the fourth N$^+$ region 502 and the P$^+$ region 404 can be coupled together by a wiring, and then coupled to the I/O port or the second power supply line GND.

Figure 5B:
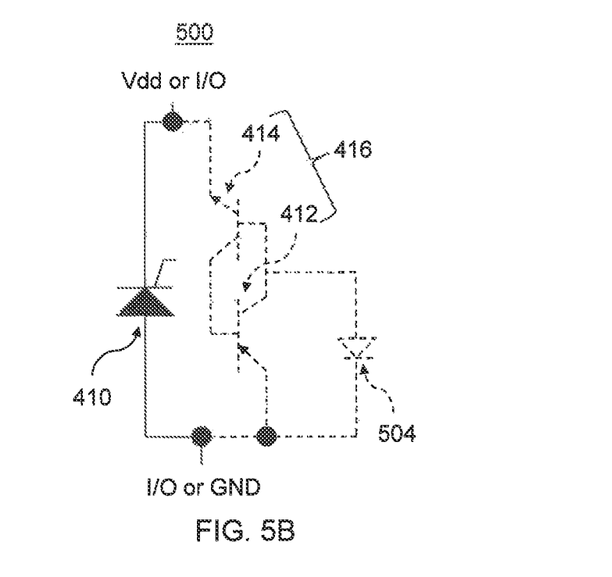

As annotated in FIG. 5A, the fourth N$^+$ region 502 (along with the first N Well 402-1) and the second P Well 206-2 form a parasitic blocking diode structure 504. The parasitic blocking diode structure 504 is coupled in parallel with the parasitic PNP BJT structure 412. An equivalent circuit of the isolation diode 500 is shown in FIG. 5B, with the parasitic SCR structure 416 and the parasitic blocking diode structure 504 represented using dashed lines. According to the present disclosure, the parasitic blocking diode structure 504 functions to block current from reaching the substrate 202, thus reducing leak current. This improves the performance of the parasitic SCR structure 416 to avoid latch-up and to prevent damage to the circuit being protected.

Figure 6A:
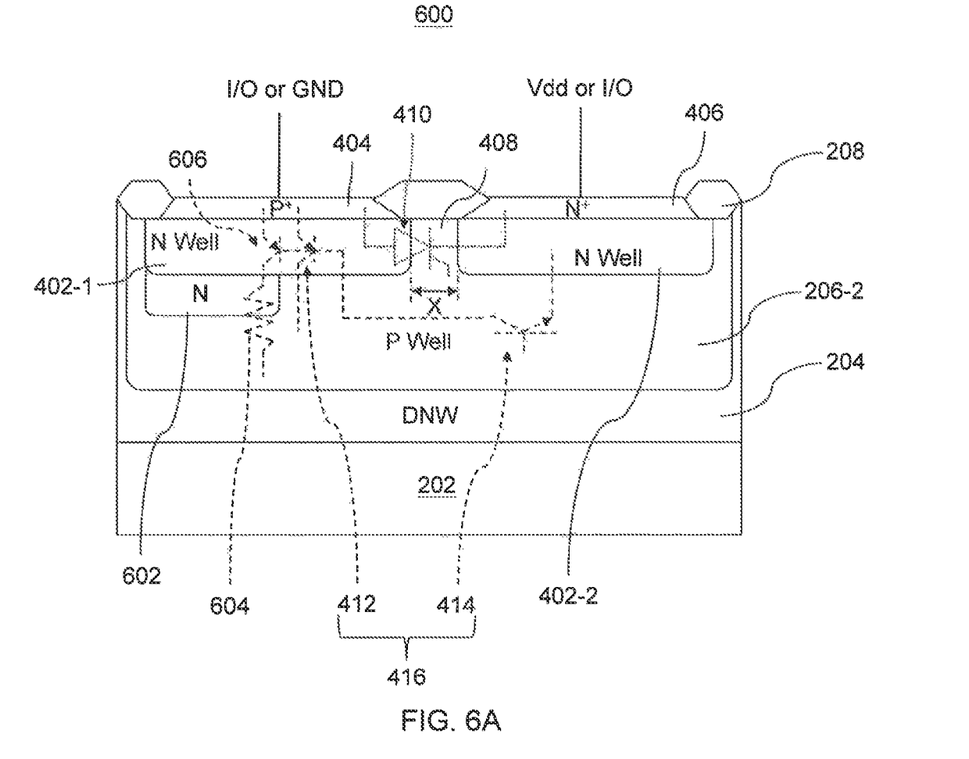
FIGS. 6A and 6B are a cross-sectional view and an equivalent circuit, respectively, of an isolation diode according to another exemplary embodiment.

FIG. 6A is a cross-sectional view of another exemplary isolation diode 600 consistent with the present disclosure. The isolation diode 600 is similar to the isolation diode 400, except that the isolation diode 600 further includes a third N-type region 602 formed below the first N Well 402-1 and in the second P Well 206-2. The third N-type region 602 is doped with an N-type dopant, such as phosphorus or arsenic, at a concentration of about $5\times10^{18}$ cm$^{-3}$ to about $1\times10^{19}$ cm$^{-3}$. In some embodiments, the doping concentration in the third N-type region 602 is higher than the doping concentration in the first N Well 402-1. As one of ordinary skill in the art will now recognize, the main current in the parasitic PNP BJT structure 412 is the hole current, which is also a major cause of latch-up. The higher doping concentration in the third N-type region 602 provides more electrons to recombine with holes in the hole current, so that latch-up is less likely to occur.

Figure 6B:
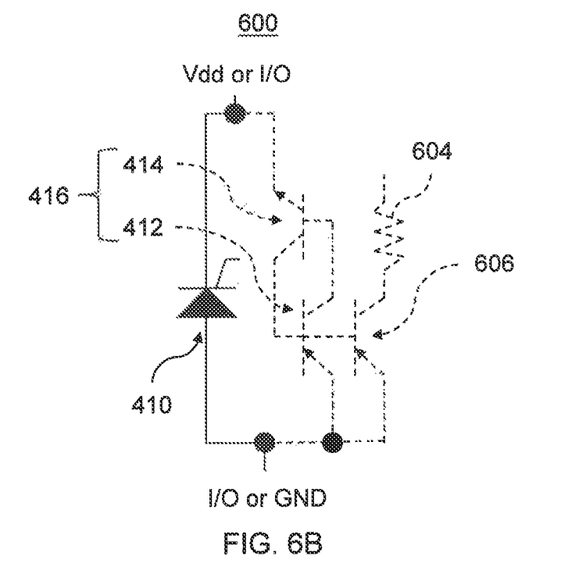

As annotated in FIG. 6A, the third N-type region 602 forms a parasitic resistor 604 coupled with a PNP BJT structure 606 formed by the P$^+$ region 404, the first N Well 402-1, and the second P Well 206-2. An equivalent circuit of the isolation diode 600 is shown in FIG. 6B, with the parasitic SCR structure 416, the parasitic PNP BJT structure 606, and the parasitic resistor 604 represented using dashed lines. According to the present disclosure, the parasitic resistor 604, like the parasitic blocking diode structure 504, reduces the amount of current that reaches the substrate 202 from the P$^+$ region 404, thus reducing leakage current.

Figure 7A:
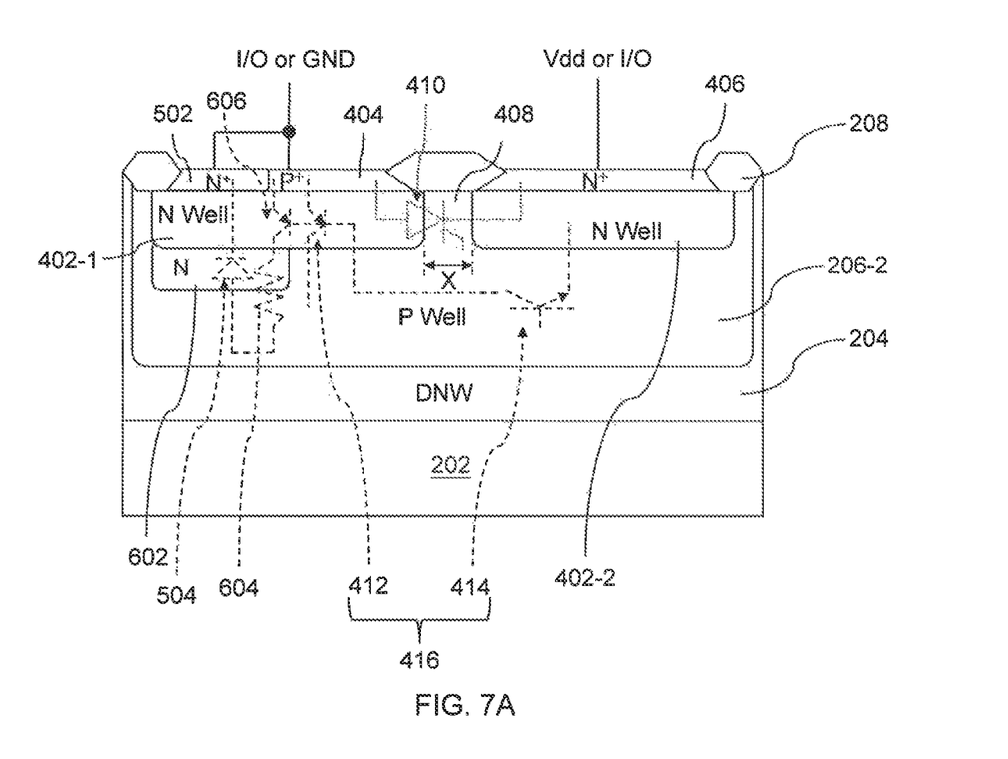
FIGS. 7A and 7B are a cross-sectional view and an equivalent circuit, respectively, of an isolation diode according to another exemplary embodiment.
Figure 7B:
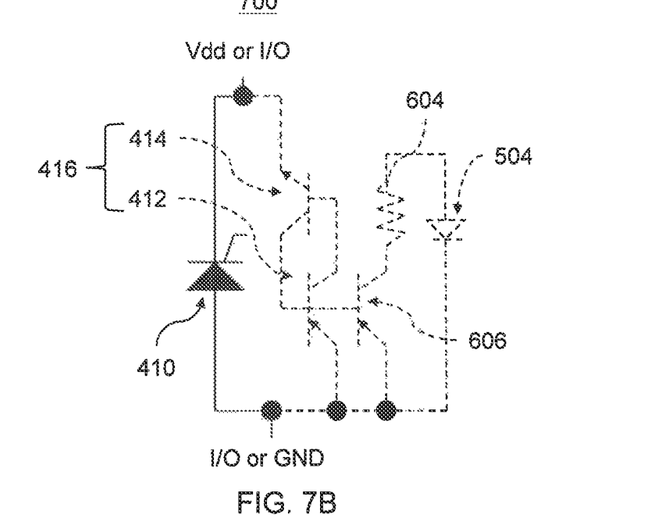

FIGS. 7A and 7B are a cross-sectional view and an equivalent circuit. Respectively, of another exemplary isolation diode 700. The isolation diode 700 is similar to the isolation diode 400, except that the isolation diode 700 further includes the fourth N$^+$ region 502 and the third N-type region 602. That is, the isolation diode 700 can be considered as a "combination" of the isolation diodes 500 and 600. Therefore, both the parasitic blocking diode structure 504 and the parasitic resistor 604 are formed in the isolation diode 700. As a result, the capability of the isolation diode 700 to block current from reaching the substrate 202 is further improved, and the leak current is further reduced.

For illustrative purposes, in FIGS. 6A, 6B, 7A, and 7B, the parasitic resistor 604 is shown as being coupled in series with the parasitic PNP BJT structure 606. One of ordinary skill in the art, however, will recognize that the parasitic resistor 604 is formed between the base and the collector of the parasitic PNP BJT structure 606.

Figure 8:
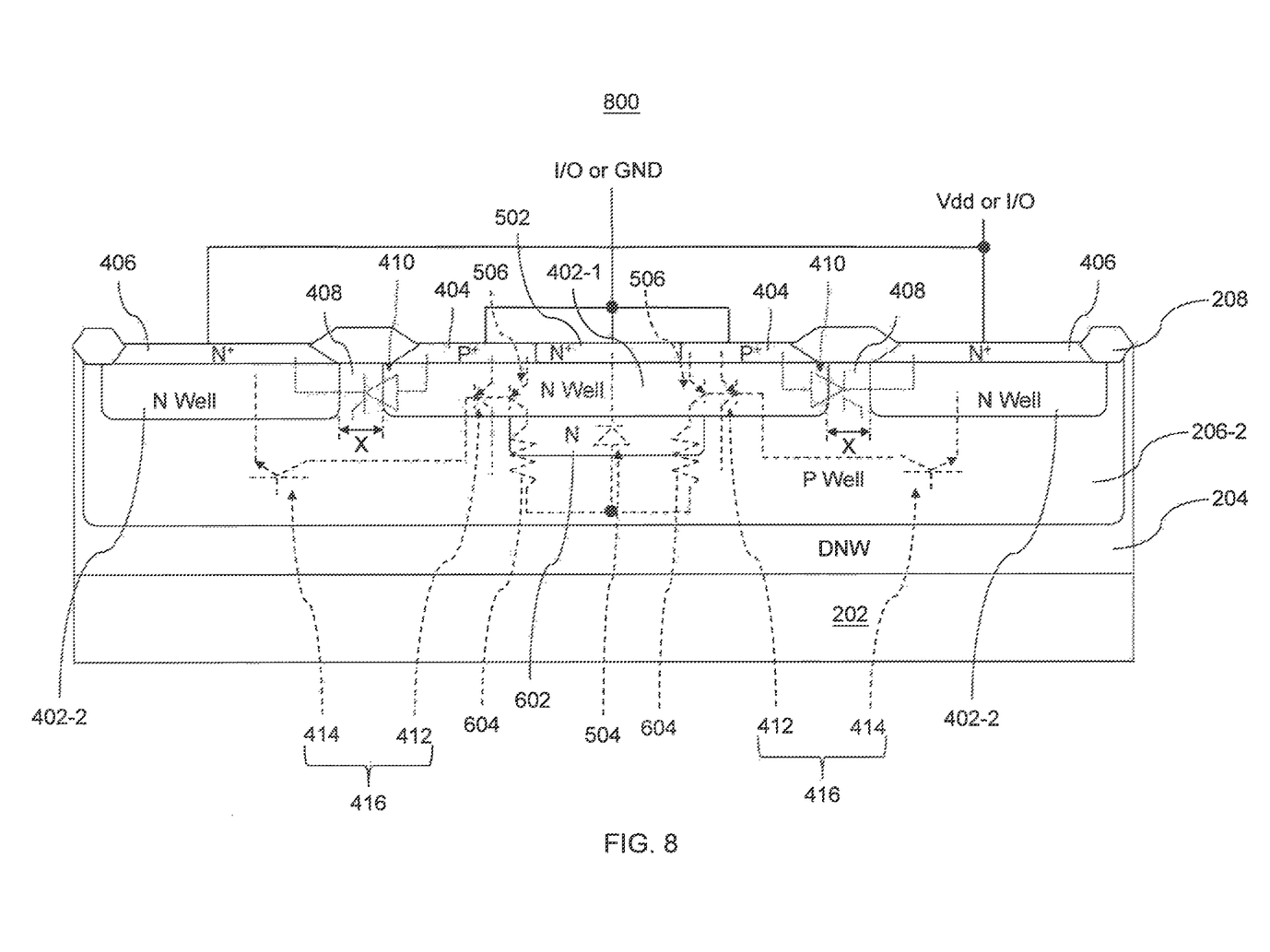
FIG. 8 is a cross-sectional view of an isolation diode according to another exemplary embodiment.

In the embodiments described above, the isolation diode has a horizontally asymmetric structure. In other embodiments, the isolation diode can have a horizontally symmetric structure. An isolation diode consistent with the present disclosure may include a combination of one of the above-described exemplary isolation diodes and a horizontal mirror thereof, with some minor modifications, such as eliminating one or more of the insulating isolation regions 208, as needed. For example, FIG. 8 is a cross-sectional view of an exemplary isolation diode 800 having a horizontally symmetric structure consistent with embodiments of the present disclosure. As shown in FIG. 8, the isolation diode 800 is constructed as a "combination" of the isolation diode 700 and a "horizontal mirror" of the isolation diode 700. The isolation diode 800 is similar to the isolation diode 700 in terms of function and equivalent circuit, and therefore detailed description of the isolation diode 800 is omitted here.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge (ESD) device, comprising:
    a power clamping circuit including a first Zener diode and a second Zener diode, a cathode of the first Zener diode being coupled to a first power supply line, an anode of the first Zener diode being coupled to an anode of the second Zener diode, and a cathode of the second Zener diode being coupled to a second power supply line; and
    an isolation circuit including a first isolation diode and a second isolation diode, a cathode of the first isolation diode being coupled to the first power supply line, an anode of the first isolation diode being coupled to a cathode of the second isolation diode and a circuit being protected, and an anode of the second isolation diode being coupled to the second power supply line,
    wherein at least one of first or second isolation diode includes
        a P-type well formed in a substrate;
        an N-type well formed in the P-type well; and
        an N-type well formed in the P-type well in contact with a partial portion of the bottom of the first N-type region, having a, higher doping concentration than the first N-type well.

2. The ESD device of claim 1, wherein the power clamping circuit includes:
    a P-type well formed in a semiconductor substrate;
    a first N-type region and a second N-type region formed in the P-type well, the first and second N-type regions sandwiching a portion of the P-type well, the first Zener diode including the first N-type region and the portion of the P-type well, and the second Zener diode including the second N-type region and the portion of the P-type well.

3. The ESD device of claim 2, wherein the power clamping circuit further includes:
    a first P-type region formed in the P-type well and below the first N-type region; and
    a second P-type region formed in the P-type well and below the second N-type region,
    the first and second N-type regions, the first and second P-type regions, and the P-type well forming a parasitic NPN bipolar-junction transistor structure.

4. The ESD protection device of claim 1, wherein the N-type well is a first N-type well, at least one of the first or second isolation diode further including:
    a second N-type well formed in the P-type well, the first and second N-type wells sandwiching a common P region in the P-type well; and
    a heavily-doped P-type (P$^+$) region formed over the first N-type well and a heavily-doped N-type (N$^+$) region formed over the second N-type well.

5. The ESD protection device of claim 4, wherein a distance between the first N-type well and the second N-type well is about 0.2 µm to about 5 µm.

6. The ESD protection device of claim 4, wherein:
    the N$^+$region is a first N$^+$region, and
    the at least one of the first or second isolation diode further includes a second N$^+$region formed in the P$^+$region, the second N$^+$region and the P$^+$region being coupled to each other by a wiring.

* * * * *